United States Patent [19]
Lee et al.

[11] Patent Number: 5,801,100
[45] Date of Patent: Sep. 1, 1998

[54] ELECTROLESS COPPER PLATING METHOD FOR FORMING INTEGRATED CIRCUIT STRUCTURES

[75] Inventors: Chwan-Ying Lee, Tainan; Tzuen-Hsi Huang, Tou Lin, both of Taiwan

[73] Assignee: Industrial Technology Research Institute, Hsinchu, Taiwan

[21] Appl. No.: 813,719

[22] Filed: Mar. 7, 1997

[51] Int. Cl.$^6$ .................................................. H01L 21/44
[52] U.S. Cl. ............................................ 438/678; 438/687
[58] Field of Search ................................ 438/678, 687; 427/98, 445.1, 305

[56] References Cited

U.S. PATENT DOCUMENTS

| | | | |
|---|---|---|---|
| 4,122,215 | 10/1978 | Vratny | 438/614 |
| 4,265,943 | 5/1981 | Goldstein et al. | 427/305 |
| 4,661,375 | 4/1987 | Thomas | 427/89 |
| 5,334,346 | 8/1994 | Kim et al. | 420/4.85 |
| 5,358,907 | 10/1994 | Wong | 438/655 |
| 5,384,284 | 1/1995 | Doan et al. | 437/190 |
| 5,431,959 | 7/1995 | Kologe | 427/304 |

OTHER PUBLICATIONS

Quirke et al. "Planar Magnetic Component Technology—A Review" IEEE Trans. on Components, Hybrids+Manufacturing Technology, vol. 15(5). Oct. 1992, pp. 884–892.

Yamaguchi et al. "Characteristics and Analysis of a Thin Film Inductor with Closed Magnetic Circuit Structure" IEEE Trans on Magnetics, vol. 28(5), Sep. 1992, pp. 3015–3017.

Ahn et al. "A Fully Integrated Planar Torroidal Inductor with a Micromachined Nikel–Iron Magnetic Bar" IEEE Trans on Components, Packaging and Manufacturing Technology Part A, vol. 17(3) Sep. 1994, pp. 463–469.

Ashby et al "High Q Inductors for Wireless Applications In a Complementary Silicon Bipolar Process" IEEE J. of Solid State Circuits, vol. 31(1), Jan. 1996, pp. 4–9.

McBrayer et al. "Diffusion of Metals in Silicon Dioxide" J. Electrochem Soc. vol. 133(6), Jun. 1986, pp. 1242–1246.

*Primary Examiner*—John Niebling
*Assistant Examiner*—Michael S. Lebentritt
*Attorney, Agent, or Firm*—George O. Saile; Stephen B. Ackerman; Alex P. Szecsy

[57] ABSTRACT

A method for fabricating a copper containing integrated circuit structure within an integrated circuit, and the copper containing integrated circuit structure formed through the method. There is first provided a substrate layer. There is then formed through a first electroless plating method a nickel containing conductor layer over the substrate layer. There is then activated the nickel containing conductor layer to form an activated nickel surface of the nickel containing conductor layer. Finally, there is then formed through a second electroless plating method a copper containing conductor layer upon the nickel containing conductor layer. Optionally, there may be formed a polysilicon layer over the substrate prior to forming the nickel containing conductor layer over the substrate, where the nickel containing conductor layer is formed upon the polysilicon layer. Optionally, there may also be formed a second nickel containing conductor layer upon the copper containing conductor layer. The method is useful in forming copper containing integrated circuit inductor structures within integrated circuits.

18 Claims, 5 Drawing Sheets

ELECTROLESS COPPER PLATING METHOD FOR FORMING INTEGRATED CIRCUIT STRUCTURES

BACKGROUND OF THE INVENTION

1. Field of the Invention

The present invention relates generally to methods for forming integrated circuit structures within integrated circuits. More particularly, the present invention relates to an electroless plating method for forming copper containing integrated circuit structures within integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

As integrated circuit device dimensions have decreased and integrated circuit device densities have increased, it has become increasingly important to form within advanced integrated circuits conductor structures of diminished dimensions while simultaneously forming conductor structures which exhibit high levels of conductivity and reliability. To assist in forming within advanced integrated circuits conductor structures of diminished dimensions while simultaneously providing conductor structures which exhibit high levels of conductivity and reliability, it is becoming more common within advanced integrated circuits to form conductor structures from copper containing conductor materials rather than the conventional aluminum containing conductor materials, since copper containing conductor materials often provide within various applications within integrated circuits copper containing conductor structures with superior electrical, mechanical and/or thermal properties. See generally, for example, Kim et al., U.S. Pat. No. 5,334,346.

While conductor structures formed within advanced integrated circuits from copper containing conductor materials typically provide within advanced integrated circuits conductor structures having higher levels of conductivity and reliability, conductor structures formed from copper containing conductor materials within advanced integrated circuits are typically not formed entirely without problems. In particular, it is often difficult to form within advanced integrated circuits conductor structures from copper containing conductor materials through conventional photolithographic and reactive ion etching (RIE) methods since copper containing conductor materials are less likely to form volatile species within reactive ion etch (RIE) plasmas employed within those conventional photolithographic and reactive ion etch (RIE) methods.

As an alternative to forming within integrated circuits conductor structures from copper containing conductor materials through conventional photolithographic and reactive ion etch (RIE) methods, it is known in the art of integrated circuit fabrication to employ selective deposition methods such as selective chemical vapor deposition (CVD) methods and selective electroless plating deposition methods to form within advanced integrated circuits conductor structures from conductor materials such as but not limited to copper containing conductor materials. See, for example, Doan et al., U.S. Pat. No. 5,384,284. In addition, with respect specifically to electroless plating deposition of copper containing conductor materials, Goldstein et al. in U.S. Pat. No. 4,265,943 discloses the use of hypophosphite as a reducing agent, in the presence of either nickel or cobalt autocatalysis promoter ions, in order to avoid use of an otherwise conventional electroless copper plating deposition composition which employs formaldehyde as a reducing agent.

With respect to specific copper containing conductor structures which may be formed from plating deposition of copper containing conductor materials within integrated circuits, it is less commonly known in the art of integrated circuit fabrication that copper containing conductor structures may be employed within the core or windings of inductor structures formed within integrated circuits. Although inductor structures have typically not traditionally been employed within integrated circuit fabrications, inductor structures have recently become of interest within integrated circuit fabrications since they may be employed within advanced integrated circuits whose applications are directed towards needs in the areas of matching electrical networks and microelectronic filters.

Methods and materials for forming inductor structures within integrated circuits are generally disclosed by Quirke et al. in "Planar Magnetic Component Technology—A Review," IEEE Trans. On Components, Hybrids and Manufacturing Technology, Vol. 15(5), October 1992, pp. 884–92. Additional examples of specific inductor structures which may be employed within integrated circuit fabrications are disclosed by: (1) Yamaguchi et al. in "Characteristics and Analysis of a Thin Film Inductor With Closed Magnetic Circuit Structure," IEEE Trans. On Magnetics, Vol. 28(5), September 1992, pp. 3015–17 (a trial spiral inductor having a closed magnetic circuit, where the trial spiral inductor is formed with a copper containing inductor conductor core); (2) Ahn et al. in "A Fully Integrated Planar Torroidal Inductor With a Micromachined Nickel-Iron Magnetic Bar," IEEE Trans. On Components, Packaging and Manufacturing Technology, Part A, Vol. 17(3), September 1994, pp. 463–69 (a planar toroidal inductor formed with thick electroplated copper containing inductor conductor windings); and (3) Ashby et al. in "High Q Inductors for Wireless Applications in a Complementary Silicon Bipolar Process," IEEE J. of Solid State Circuits, Vol. 31(1), January 1996, pp. 4–9 (a rectangular spiral inductor formed within a bipolar complementary metal oxide semiconductor (BiCMOS) integrated circuit).

While methods and materials for forming copper containing integrated circuit structures, such as but not limited to copper containing integrated circuit inductor structures, within integrated circuits are thus becoming more common in the art of integrated circuit fabrication, there nonetheless continues to exist concerns within integrated circuits with respect to interdiffusion of copper layers from which are formed copper containing integrated circuit structures with integrated circuit substrate layers upon which are formed those copper containing integrated circuit structures. Such interdiffusion of copper containing integrated circuit structures with silicon oxide and silicon substrate layers typical within integrated circuits has been disclosed by McBrayer et al., in "Diffusion of Metals in Silicon Dioxide," J. Electrochem. Soc., Vol. 133(6), June 1986, pp. 1242–46.

It is thus desirable in the art to provide methods and materials through which there may be formed within integrated circuits copper containing integrated circuit structures with limited interdiffusion of copper containing conductor layers from which are formed those copper containing integrated circuit structures with integrated circuit layers adjoining those copper containing integrated circuit structures. More desirable in the art are methods and materials through which copper containing conductor layers within copper containing integrated circuit inductor structures may be formed with limited interdiffusion of those copper containing conductor layers with integrated circuit layers adjoining those copper containing integrated circuit inductor structures. It is towards the foregoing goals that the present invention is more specifically directed.

SUMMARY OF THE INVENTION

A first object of the present invention is to provide a method for forming a copper containing integrated circuit structure within an integrated circuit.

A second object of the present invention is to provide a method in accord with the first object of the present invention, where there is avoided interdiffusion of a copper containing conductor layer from which is formed the copper containing integrated circuit structure with integrated circuit layers adjoining the copper containing integrated circuit structure.

A third object of the present invention is to provide a method in accord with the first object of the present invention and the second object of the present invention, where the copper containing integrated circuit structure is a copper containing integrated circuit inductor structure.

A fourth object of the present invention is to provide a method in accord with the first object of the present invention, the second object of the present invention and the third object of the present invention, which method is readily manufacturable.

In accord with the objects of the present invention, there is provided by the present invention a method for forming a copper containing integrated circuit structure within an integrated circuit, as well as the integrated circuit having the copper containing integrated circuit structure formed therein. To practice the method of the present invention, there is first provided a substrate layer. There is then formed through a first electroless plating method a nickel containing conductor layer over the substrate layer. There is then activated the nickel containing conductor layer to form an activated nickel surface of the nickel containing conductor layer. Finally, there is then formed through a second electroless plating method a copper containing conductor layer upon the nickel containing conductor layer. The method of the present invention contemplates a copper containing integrated circuit structure formed through the method of the present invention.

The present invention provides a method for forming a copper containing integrated circuit structure within an integrated circuit, where there is avoided interdiffusion of a copper containing conductor layer within the copper containing integrated circuit structure with integrated circuit layers adjoining the copper containing integrated circuit structure. The method and copper containing integrated circuit structure of the present invention achieve the foregoing object by forming within the copper containing integrated circuit structure a nickel containing conductor layer beneath a copper containing conductor layer. In such a configuration, the nickel containing conductor layer serves as barrier layer to avoid interdiffusion of the copper containing conductor layer within the copper containing integrated circuit structure with integrated circuit layers adjoining the copper containing integrated circuit structure.

The present invention may be employed where the copper containing integrated circuit structure is a copper containing integrated circuit inductor structure. The present invention does not discriminate with respect to the nature of the copper containing integrated circuit structure within which there is avoided interdiffusion of a copper containing conductor layer with integrated circuit layers adjoining the copper containing integrated circuit structure. Thus, the present invention may be employed where the copper containing integrated circuit structure is a copper containing integrated circuit inductor structure, as well as other copper containing integrated circuit structures.

The method and integrated circuit structure of the present invention are readily manufacturable. The method of present provides that a copper containing integrated circuit structure is formed with a nickel containing conductor layer beneath a copper containing layer within the copper containing integrated circuit structure. As is illustrated within the Description of the Preferred Embodiment, nickel containing conductor layers and copper containing conductor layers may be formed within integrated circuit structures through electroless plating deposition methods. Thus, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
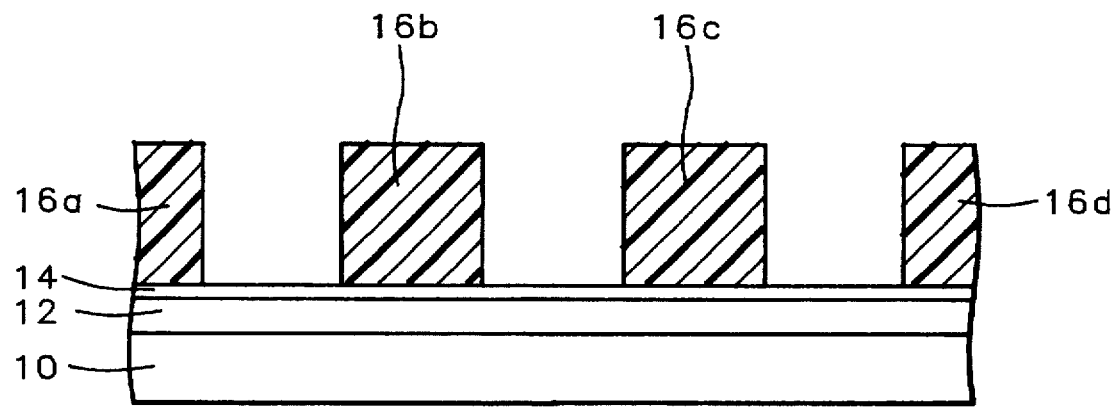
FIG. 1 to FIG. 6 show a series of schematic cross-sectional diagrams illustrating the results of progressive stages in forming upon a substrate layer a copper containing integrated circuit inductor structure in accord with a preferred embodiment of the present invention.

The present invention provides a method for forming a copper containing integrated circuit structure within an integrated circuit, where there is avoided interdiffusion of a copper containing conductor layer within the copper containing integrated circuit structure with integrated circuit layers adjoining the copper containing integrated circuit structure. The method of the present invention achieves this object by forming within the copper containing integrated circuit structure a nickel containing conductor layer beneath the copper containing conductor layer, where the nickel containing conductor layer serves as a barrier layer to interdiffusion of the copper containing conductor layer with integrated circuit layers adjoining the copper containing integrated circuit structure.

Although the preferred embodiment of the present invention illustrates the method of the present invention employed in forming a copper containing integrated circuit inductor structure within an integrated circuit, the method of the present invention may be employed in forming copper containing integrated circuit structures other than copper containing integrated circuit inductor structures within integrated circuits. The method of the present invention may be employed in forming within integrated circuits other copper containing integrated circuit structures including but not limited to copper containing integrated circuit conductor structures and copper containing integrated circuit structures within electrical circuit elements other than inductors within integrated circuits.

Similarly, although the preferred embodiment of the present invention illustrates the use of a first electroless plating method for forming a nickel containing conductor laying within a copper containing integrated circuit structure, where the nickel containing conductor layer is formed as a barrier layer within the copper containing integrated circuit structure beneath a copper containing conductor layer within the copper containing integrated circuit structure, the present invention also contemplates that nickel containing conductor layers and copper containing conductor layers may be formed within copper containing integrated circuit structures through methods other than electroless plating methods to form copper containing integrated circuit structures wherein there is avoided interdiffusion of copper containing conductor layers within those copper containing integrated circuit structures with integrated circuit layers adjoining those copper containing integrated circuit structures. In general, within the method of the present invention nickel containing conductor layers may be formed below, above and/or surrounding copper containing conductor layers to provide within copper containing integrated circuit structures within integrated circuits barrier layers to avoid interdiffusion of the copper containing conductor layers with integrated circuit layers adjoining the copper containing integrated circuit structures. The integrated circuit layers adjoining the copper containing integrated circuit structures may include, but are not limited to, integrated circuit conductor layers, integrated circuit semiconductor layers and integrated circuit dielectric layers.

Referring now to FIG. 1 to FIG. 6, there is shown a series of schematic cross-sectional diagrams illustrating the results of progressive stages in forming within an integrated circuit a copper containing integrated circuit inductor structure in accord with a preferred embodiment of the method of the present invention. Shown in FIG. 1 is a schematic cross-sectional diagram of the integrated circuit at an early stage in its fabrication.

Shown in FIG. 1 is a semiconductor substrate 10 having formed thereupon a substrate layer 12 which in turn has formed thereupon a blanket first polysilicon layer 14 which in turn has formed thereupon a series of patterned photoresist layers 16a, 16b, 16c and 16d. Each of the foregoing substrate and layers may be formed through methods and materials as are conventional in the art of integrated circuit fabrication.

For example, while it is known in the art of integrated circuit fabrication that semiconductor substrates may be formed with either dopant polarity, several dopant concentrations and various crystallographic orientations, for the preferred embodiment of the present invention the semiconductor substrate 10 is preferably a (100) silicon semiconductor substrate having a N- or P- doping. Similarly, although it is also known in the art of integrated circuit fabrication that substrate layers may be formed within integrated circuits from any of several substrate materials including but not limited to conductor substrate materials, semiconductor substrate materials and dielectric substrate materials, for the preferred embodiment of the present invention the substrate layer 12 is preferably formed from a dielectric substrate material. Although substrate layers formed of dielectric substrate materials may be formed within integrated circuits through any of several methods, including but not limited to chemical vapor deposition (CVD) methods, plasma enhanced chemical vapor deposition (PECVD) methods and physical vapor deposition (PVD) sputtering methods through which may be formed substrate layers of dielectric substrate materials including but not limited to silicon oxide dielectric materials, silicon nitride dielectric materials and silicon oxynitride dielectric materials, for the preferred embodiment of the present invention, the substrate layer 12 is preferably formed of a silicon oxide dielectric material deposited through a plasma enhanced chemical vapor deposition (PECVD) method, as is most common in the art. Preferably, the substrate layer 12 so formed is from about 300 to about 15000 angstroms thick.

With respect to the blanket first polysilicon layer 14 as illustrated in FIG. 1, the blanket first polysilicon layer 14 may be formed through any of several methods and materials through which polysilicon layers are conventionally formed within integrated circuits, such methods including but not limited to chemical vapor deposition (CVD) methods, low pressure chemical vapor deposition (LPCVD) methods and physical vapor deposition (PVD) sputtering methods through which are formed polysilicon layers from suitable source materials, such as but not limited to silane source materials, disilane source materials and suitable silicon target source materials. For the preferred embodiment of the present invention, the blanket first polysilicon layer 14 is preferably formed through a low pressure chemical vapor deposition (LPCVD) method employing a suitable silicon source material, such as but not limited to silane or disilane, although other methods and materials may be employed in forming the blanket first polysilicon layer 14. Preferably, the blanket first polysilicon layer 14 so formed is from about 1000 to about 3000 angstroms thick.

Finally, the patterned photoresist layers 16a, 16b, 16c and 16d may also be formed through photolithographic methods and materials as are common in the art of integrated circuit fabrication. Although the patterned photoresist layers 16a, 16b, 16c and 16d may be formed from any of several photoresist materials chosen from the general groups of photoresist materials including but not limited to positive photoresist materials and negative photoresist materials, for the preferred embodiment of the present invention the patterned photoresist layers 16a, 16b, 16c and 16d are preferably formed of a positive novolak photoresist material as is commonly employed within integrated circuit fabrication to provide patterned photoresist layers of narrow and stable linewidth and pitch. Preferably, the patterned photoresist layers 16a, 16b, 16c and 16d each have a thickness of from about 8000 to about 12000 angstroms, each have a linewidth upon the blanket first polysilicon layer 14 of from about 0.6 to about 50 microns and define a pitch exposing portions of the blanket first polysilicon layer 14 of from about 0.6 to about 50 microns.

Although it is not specifically illustrated in FIG. 1, the semiconductor substrate 10 in addition to having the substrate layer 12, the blanket polysilicon layer 14 and the patterned photoresist layers 16a, 16b, 16c and 16d formed thereupon and thereover will also typically have integrated circuit devices and electrical circuit elements formed therein, thereupon and/or thereover. Such integrated circuit devices and electrical circuit elements typically include, but are not limited to, transistors, resistors, diodes, capacitors, conductor elements and dielectric elements.

Figure 2:
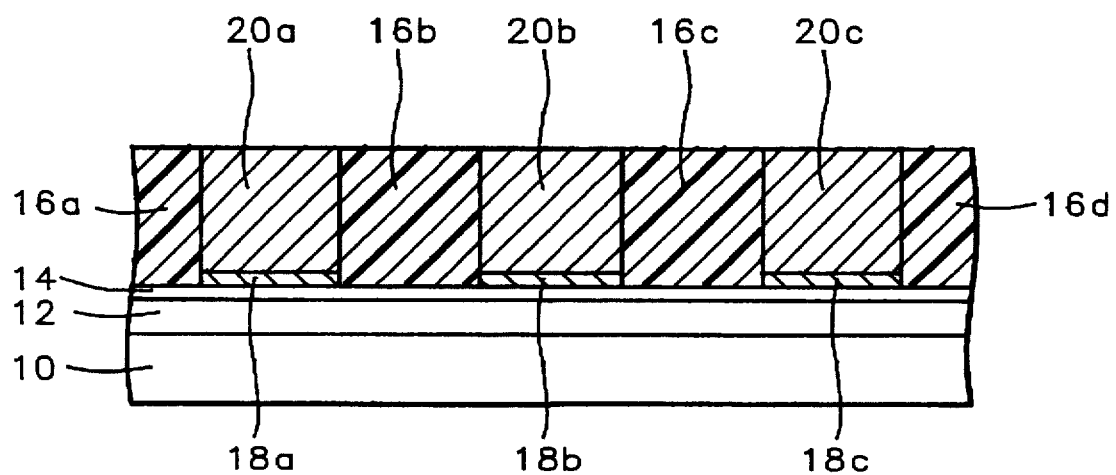

Referring now to FIG. 2, there is shown a schematic cross-sectional diagram of an integrated circuit illustrating the results of further processing of the integrated circuit whose schematic cross-sectional diagram is illustrated in FIG. 1. Shown in FIG. 2 is a schematic cross-sectional diagram of an integrated circuit otherwise equivalent to the integrated circuit whose schematic cross-sectional diagram is shown in FIG. 1 but, where there is: (1) formed upon a series of exposed portions of the blanket first polysilicon layer 14 separated by the patterned photoresist layers 16a, 16b, 16c and 16d a series of patterned first lower nickel containing conductor layers 18a, 18b and 18c; and (2) formed upon the series of patterned first lower nickel containing conductor layers 18a, 18b and 18c a series of patterned first copper containing conductor layers 20a, 20b and 20c.

Within the preferred embodiment of the present invention, the patterned first lower nickel containing conductor layers 18a, 18b and 18c are preferably formed through a first electroless plating method employing an aqueous electroless nickel planting solution comprising: (1) about 25 to about 35 grams per liter nickel sulfate; (2) about 5 to about 10 grams per liter sodium hypophosphite; (3) about 64 to about 80 grams per liter sodium citrate; (4) about 40 to about 50 grams per liter ammonium chloride; and (5) about 30 to about 50 grams per liter ammonia (to maintain a pH of about 9.5 to about 10.5). The aqueous electroless nickel plating solution is preferably maintained at a temperature about 70 to about 80 degrees centigrade. When employing the foregoing concentrations and conditions within the first electroless plating method, there are formed patterned first lower nickel containing conductor layers 18a, 16b 16c which preferably have a phosphorus content of about 3.2 to about 4.8 weight percent. In comparison with other electroless nickel plating methods which produce nickel containing conductor layers of up to about 12 percent phosphorus, the patterned first lower nickel containing conductor layers 18a, 18b and 18c formed in accord with the preferred embodiment of the present invention and preferably having a phosphorus content of from about 3.2 to about 4.8 percent by weight are substantially less likely to form pinholes which compromise the barrier layer properties of the patterned first lower nickel containing conductor layers 18a, 18b and 18c. Preferably, the patterned first lower nickel containing conductor layers 18a, 18b and 18c are formed to a thickness of from about 1000 to about 2000 angstroms each.

The blanket first polysilicon layer 14 as employed within the preferred embodiment of the present invention provides several advantages within the copper containing integrated circuit structure formed in accord with the preferred embodiment of the present invention. First, the blanket first polysilicon layer 14 serves as an adhesion promoter layer between the substrate layer 12 and the patterned first lower nickel containing conductor layers 18a, 18b and 18c. In addition, the portions of the blanket first polysilicon layer 14 exposed through the patterned photoresist layers 16a, 16b, 16c and 16d also serve as autocatalysis sites for forming the patterned first lower nickel containing conductor layers 18a, 18b and 18c upon the portions of the blanket first polysilicon layer 14 exposed through the patterned photoresist layers 16a, 16b, 16c and 16d. Presumably, although not necessarily exclusively, the autocatalysis reaction involves the concomitant oxidation of those portions of the blanket first polysilicon layer 14 and the corresponding reduction of nickel ions to nickel metal. Thus, under circumstances where it is desired to employ the method of the present invention for forming over a substrate layer, such as the substrate layer 12, a nickel containing conductor layer where the nickel containing conductor layer is formed upon an integrated circuit layer which is not autocatalytic for electroless nickel deposition, there must typically alternatively be employed within the method of the present invention an independent activating agent for forming the nickel layer, such as the patterned lower nickel containing conductor layers 18a, 18b and 18c upon the integrated circuit layer.

With respect to the deposition of the patterned first copper containing conductor layers 20a, 20b and 20c upon the corresponding patterned first lower nickel containing conductor layers 18a, 18b and 18c, there is employed within the preferred embodiment of the present invention an activator solution for activating the patterned first lower nickel containing conductor layers 18a, 18b and 18c such that the patterned first copper containing conductor layers 20a, 20b and 20c may be electrolessly formed thereupon. Although any of several activator solutions may be employed in activating the patterned first lower nickel containing conductor layers 18a, 18b and 18c, which activator solutions typically at least in part comprise solutions of precious metal ions, for the preferred embodiment of the present invention the activator solution is preferably an aqueous palladium ion activator solution comprising about: (1) 0.1 to about 0.2 grams per liter palladium chloride; (2) about 450 to about 550 milliliters glacial acetic acid per liter activator solution; and (3) about 200 to about 300 milliliters 49 percent aqueous hydrofluoric acid per liter activator solution. The exposed surfaces of the patterned first lower nickel containing conductor layers 18a, 18b and 18c are preferably activated through immersion in the activator solution at a temperature of from about 22 to about 28 degrees centigrade for a time period of from about 5 to about 10 seconds.

Upon activating the surfaces of the patterned first lower nickel containing conductor layers 18a, 18b and 18c, there is then formed upon the patterned first lower nickel containing conductor layers 18a, 18b and 18c the series of patterned first copper containing conductor layers 20a, 20b and 20c. Similarly with the patterned first lower nickel containing conductor layers 18a, 18b and 18c, the patterned first copper containing conductor layers 20a, 20b and 20c are formed through a second electroless plating deposition method. Within the second electroless plating deposition method, nickel ion is preferably employed as a mediator ion, although other mediator ions, such as but not limited to cobalt mediator ions and palladium mediator ions may also be employed within the second electroless plating deposition method employed within the preferred embodiment of the present invention. The second electroless plating deposition method preferably employs an aqueous electroless plating solution comprising: (1) about 7 to about 10 grams per liter copper sulfate; (2) about 15 to about 20 grams per liter sodium citrate; (3) about 7.5 to about 11.5 grams per liter sodium hypophosphite (although other non-formaldehyde reducing agents, such as but not limited to dimethyl amino borane (DMAB) may also be employed within the method of the present invention); (4) about 7.5 to about 12.5 grams per liter boric acid; and (5) about 0.35 to about 0.75 grams per liter nickel sulfate. When employing an electroless plating solution comprised of the foregoing materials and concentrations at a pH of from about 9.0 to about 9.5 and a deposition temperature of from about 60 to about 70 degrees centigrade, there is typically formed patterned copper containing conductor layers 20a, 20b and 20c of composition about 94 to about 96 weight percent copper, about 2 to about 3 weight percent phosphorus and about 2 to about 3 weight percent nickel. Preferably, the patterned copper containing conductor layers 20a, 20b and 20c so formed are formed to a height no greater than the thickness of the patterned photoresist layers 16a, 16b, 16c and 16d, in order to assure that there is formed straight sided patterned copper containing conductor layers 20a, 20b and 20c.

Figure 3:
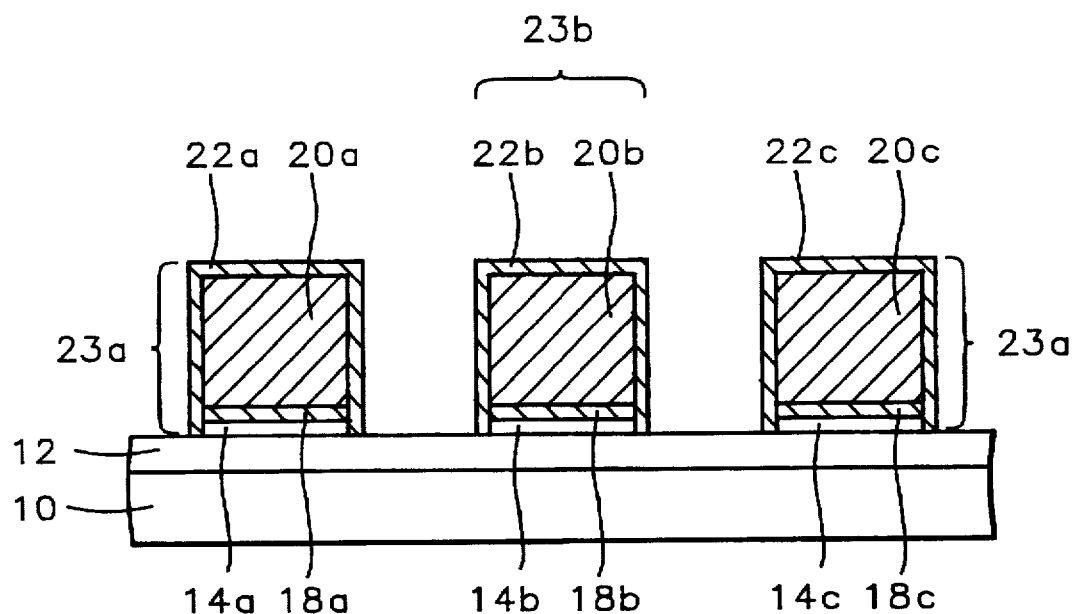

Referring now to FIG. 3, there is shown a schematic cross-sectional diagram illustrating the results of further processing of the integrated circuit whose schematic cross-sectional diagram is illustrated in FIG. 2. Shown in FIG. 3 is a schematic cross-sectional diagram of an integrated circuit otherwise equivalent to the integrated circuit whose schematic cross-sectional diagram is illustrated in FIG. 2, but from which there has been removed the patterned photoresist layers 16a, 16b, 16c and 16d. Although the patterned photoresist layers 16a, 16b, 16c and 16d may be removed from the integrated circuit whose schematic cross-sectional diagram is illustrated in FIG. 2 through any of several methods as are common in the art, including but not limited to wet chemical photoresist stripping methods and dry plasma photoresist stripping methods, for the preferred embodiment of the present invention the patterned photoresist layers 16a, 16b, 16c and 16d are preferably removed from the integrated circuit whose schematic cross-sectional diagram is illustrated in FIG. 2 through a dry plasma photoresist stripping method.

There is also shown in FIG. 3, after having removed the patterned photoresist layers 16a, 16b, 16c and 16d, the results of etching the blanket first polysilicon layer 14 to form the patterned first polysilicon layers 14a, 14b and 14c. The blanket first polysilicon layer 14 is preferably etched to form the patterned first polysilicon layers 14a, 14b and 14c through a reactive ion etch (RIE) method employing a reactant gas composition appropriate to the blanket first polysilicon layer 14, which reactant gas composition will typically, although not exclusively, employ a chlorine containing reactant gas. As is illustrated in FIG. 3, the patterned first polysilicon layers 14a, 14b and 14c are etched while employing the patterned first lower nickel containing conductor layers 18a, 18b and 18c and the patterned first copper containing conductor layers 20a, 20b and 20c as etch mask layers.

Finally, there is shown in FIG. 3 the presence of a series of patterned first upper nickel containing conductor layers 22a, 22b and 22c formed upon exposed portions of the corresponding patterned first copper containing conductor layers 20a, 20b and 20c, the corresponding patterned first lower nickel containing conductor layers 18a, 18b and 18c and the corresponding patterned first polysilicon layers 14a, 14b and 14c. The patterned first upper nickel containing conductor layers 22a, 22b and 22c are preferably formed through methods and materials analogous or equivalent to the methods and materials employed in forming the patterned first lower nickel containing conductor layers 18a, 18b and 18c. Since the patterned first copper containing conductor layers 20a, 20b and 20c are autocatalytic for electroless deposition of nickel containing conductor layers upon the patterned first copper containing conductor layers 20a, 20b and 20c, the patterned first upper nickel containing conductor layers 22a, 22b and 22c are formed upon the exposed portions of the patterned first copper containing conductor layers 20a, 20b and 20c, the patterned first lower nickel containing conductor layers 18a, 18b and 18c and the patterned first polysilicon layers 14a, 14b and 14c without any additional activation. Preferably, the patterned first upper nickel containing conductor layers 22a, 22b and 22c are formed to a thickness of from about 1000 to about 2000 angstroms each.

As is illustrated in FIG. 3, the patterned first copper containing conductor layers 20a, 20b and 20c are enclosed by the corresponding patterned first lower nickel containing conductor layers 18a, 18b and 18c and the corresponding patterned first upper nickel containing conductor layers 22a, 22b and 22c form a series of patterned lower copper containing integrated circuit inductor winding layers 23a, 23b and 23c.

Figure 4:
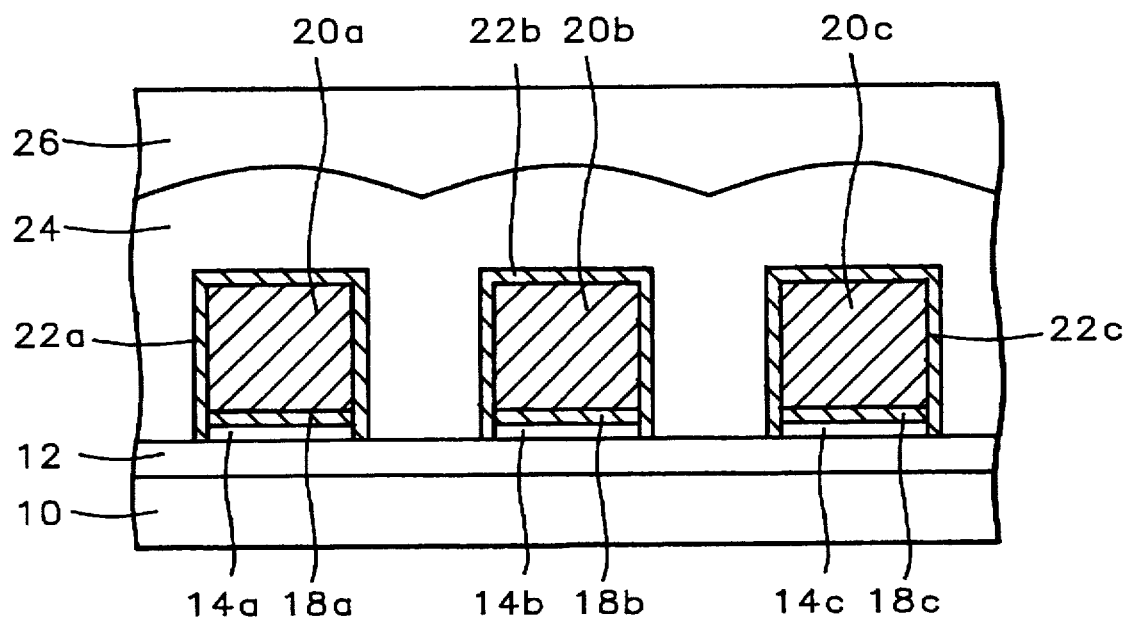

Referring now to FIG. 4, there is shown a schematic cross-sectional diagram illustrating the results of further processing of the integrated circuit whose schematic cross-sectional diagram is illustrated in FIG. 3. Shown in FIG. 4 is a schematic cross-sectional diagram of an integrated circuit otherwise equivalent to the integrated circuit whose schematic cross-sectional diagram is illustrated in FIG. 3, but upon whose surface is formed: (1) a blanket conformal dielectric layer 24 which in turn has formed thereupon; (2) a blanket planarizing dielectric layer 26. The blanket conformal dielectric layer 24 and the blanket planarizing dielectric layer 26 may be formed through methods and materials as are conventional in the art of integrated circuit fabrication. For example, blanket conformal dielectric layers may be formed within integrated circuits through methods including but not limited to chemical vapor deposition (CVD) methods, plasma enhanced chemical vapor deposition (PECVD) methods and physical vapor deposition (PVD) sputtering methods through which may be formed blanket conformal dielectric layers of dielectric materials including but not limited to silicon oxide dielectric materials, silicon nitride dielectric materials and silicon oxynitride dielectric materials. Similarly, blanket planarizing dielectric layers may be formed within integrated circuits through methods including but not limited to spin-on-glass planarizing methods and certain chemical vapor deposition (CVD) planarizing methods through which may be formed blanket planarizing dielectric layers of dielectric materials including but not limited to spin-on-glass dielectric materials and certain silicon oxide dielectric materials. For the preferred embodiment of the present invention, the blanket conformal dielectric layer 24 is preferably formed of a silicon oxide dielectric material deposited through a plasma enhanced chemical vapor deposition (PECVD) method, as is common in the art of integrated circuit fabrication. Preferably, the blanket conformal dielectric layer 24 is formed to a thickness of from about 9500 to about 15000 angstroms. Similarly, for the preferred embodiment of the present invention the blanket planarizing dielectric layer 26 is preferably formed of a spin-on-glass dielectric material deposited upon the blanket conformal dielectric layer 24 through a spin-on-glass planarizing method to a thickness of from about 1800 to about 2200 angstroms.

Figure 5:
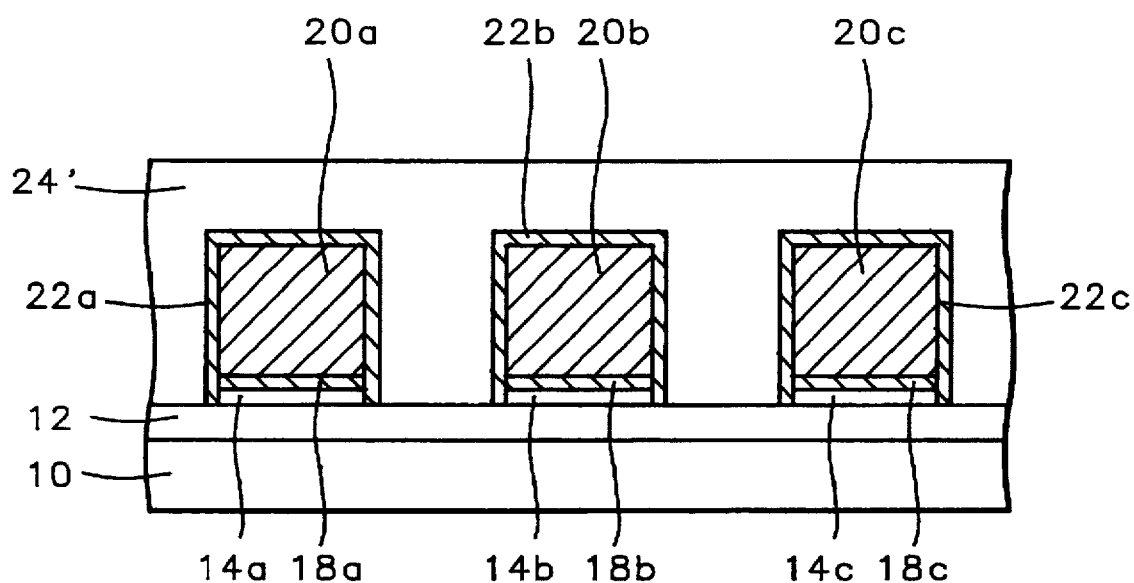

Referring now to FIG. 5, there is shown a schematic cross-sectional diagram illustrating the results of further processing of the integrated circuit whose schematic cross-sectional diagram is illustrated in FIG. 4. Shown in FIG. 5 is the results of planarizing the blanket planarizing dielectric layer 26 and the blanket conformal dielectric layer 24 to form the planarized blanket conformal dielectric layer 24'. Although the blanket planarizing dielectric layer 26 and the blanket conformal dielectric layer 24 may be planarized through any of several methods as are known in the art of integrated circuit fabrication, including but not limited to reactive ion etch (RIE) etchback planarizing methods and chemical mechanical polish (CMP) planarizing methods, for the preferred embodiment of the present invention, the blanket planarizing dielectric layer 26 and the blanket conformal dielectric layer 24 are preferably planarized to yield the planarized blanket conformal dielectric layer 24' through a chemical mechanical polish (CMP) planarizing method, as is common in the art of integrated circuit fabrication.

Figure 6:
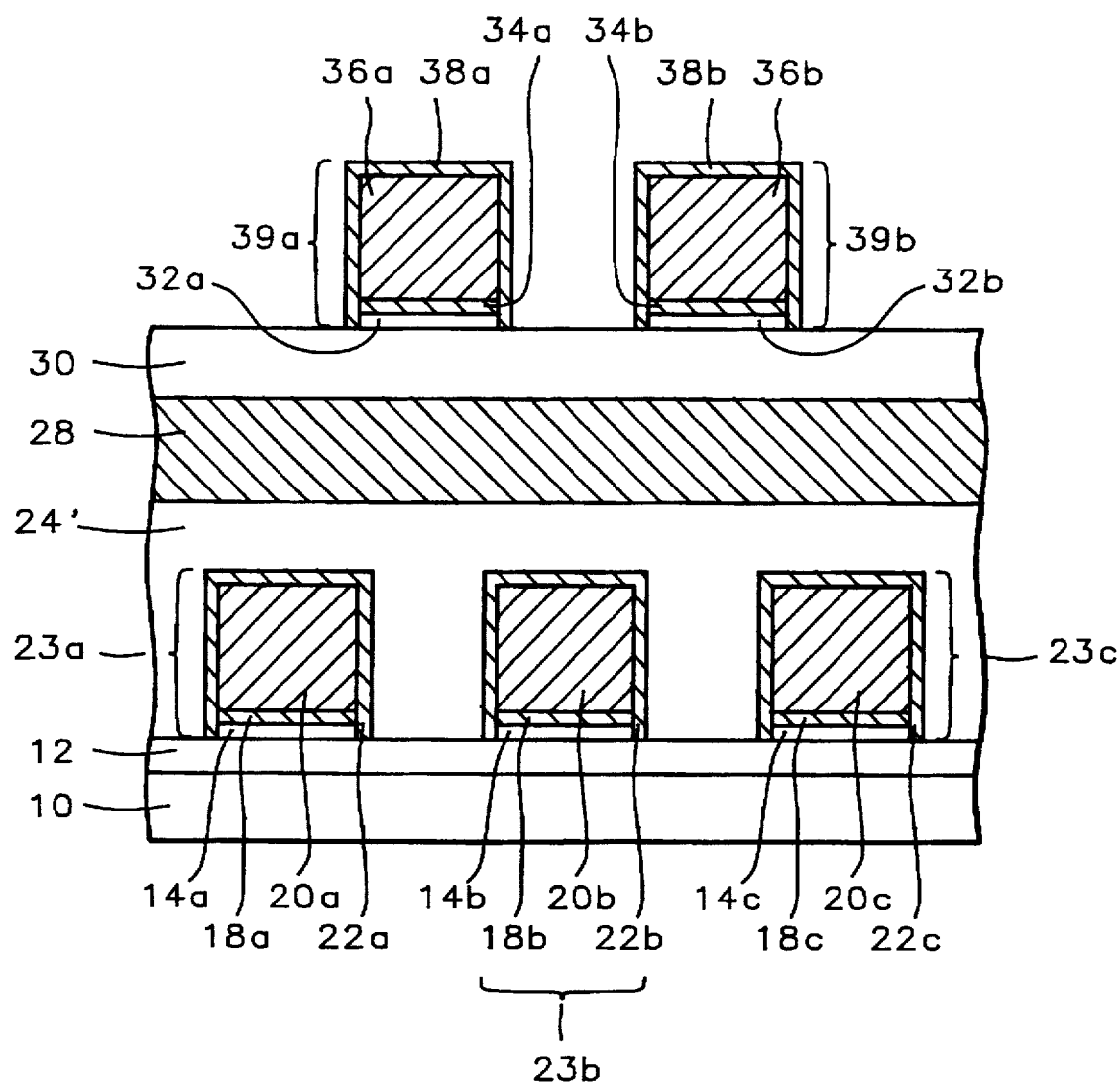

Referring now to FIG. 6, there is shown a schematic cross-sectional diagram illustrating the results of further processing of the integrated circuit whose schematic cross-sectional diagram is illustrated in FIG. 5. Shown in FIG. 6 is a schematic cross-sectional diagram of an integrated circuit otherwise equivalent to the integrated circuit whose schematic cross-sectional diagram is illustrated in FIG. 5, but upon whose surface is formed a patterned inductor core layer 28 having formed thereupon a planarized second dielectric layer 30 which in turn has formed thereupon several structures which comprise a pair of patterned upper copper containing integrated circuit inductor winding layers 39a and 39b.

The patterned inductor core layer 28 as illustrated within FIG. 6 may be formed through methods and materials through which inductor cores layers are conventionally formed within integrated circuit inductor structures within integrated circuits. Such methods and materials include but are not limited to plating methods, chemical vapor deposition (CVD) methods and physical vapor deposition (PVD) sputtering methods through which are deposited inductor core layers of inductor core materials including but are not limited to ferrites, permalloy alloys and other soft magnetic materials. For the preferred embodiment of the present invention, the patterned inductor core layer 28 may be formed from any of the foregoing inductor core materials, preferably to a thickness of from about 8000 to about 12000 angstroms.

With respect to the planarized second dielectric layer 30, the planarized second dielectric layer 30 is preferably formed through methods and materials analogous or equivalent to the methods and materials employed in forming the planarized blanket conformal dielectric layer 24'. Preferably, the planarized second dielectric layer 30 is formed to a thickness of from about 5000 to about 6000 angstroms.

Finally, there is shown in FIG. 6 the pair of patterned upper copper containing integrated circuit inductor winding layers 39a and 39b which are comprised of the patterned second lower nickel containing conductor layers 34a and 34b, the corresponding patterned second copper containing conductor layers 36a and 36b and the corresponding patterned second upper nickel containing conductor layers 38a and 38b, where each patterned upper copper containing integrated circuit inductor winding layer 39a or 39b within the pair of patterned upper copper containing integrated circuit inductor winding layer 39a or 39b is formed upon a corresponding patterned second polysilicon layer 32a or 32b. The patterned second polysilicon layers 32a and 32b are preferably formed through methods, materials and dimensions analogous or equivalent to the methods, materials and dimensions employed in forming the patterned polysilicon layers 14a, 14b and 14c. Similarly, the patterned second lower nickel containing conductor layers 34a and 34b are preferably formed through methods, materials and dimensions analogous or equivalent to the methods, materials and dimensions employed in forming the patterned first lower nickel containing conductor layers 18a, 18b and 18c. Additionally, the patterned second copper containing conductor layers 36a and 36b are preferably formed through methods, materials and dimensions analogous or equivalent to the methods, materials and dimensions employed in forming the patterned first copper containing conductor layers 20a, 20b and 20c. Finally, the patterned second upper nickel containing conductor layers 38a and 38b are preferably formed through methods, materials and dimensions analogous or equivalent to the methods, materials and dimensions employed in forming the patterned first upper nickel containing conductor layers 22a, 22b and 22c.

Figure 7:
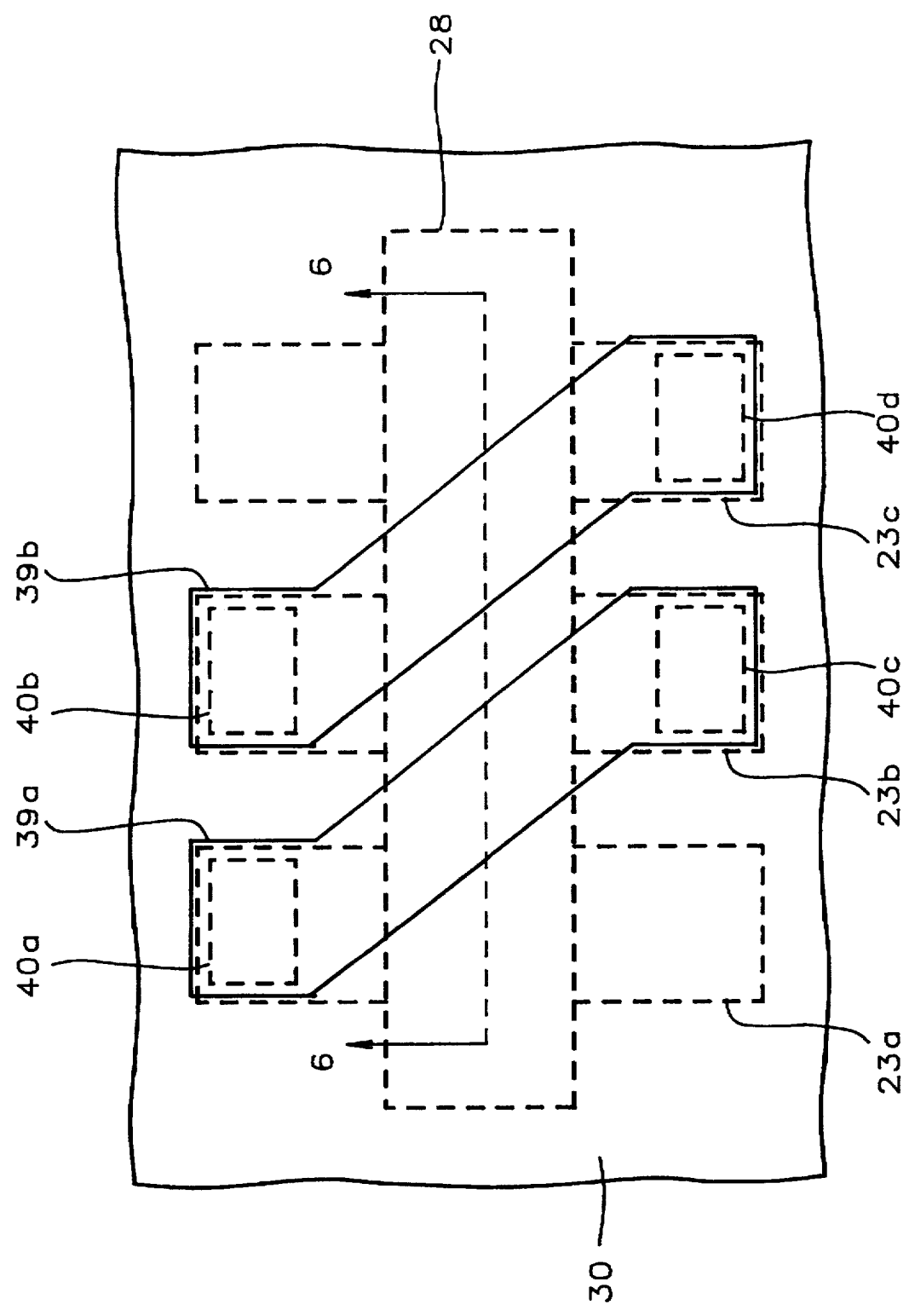
FIG. 7 shows a schematic plan-view diagram of the copper containing integrated circuit inductor structure corresponding with the schematic cross-sectional diagram of the copper containing integrated circuit inductor structure as illustrated in FIG. 6.

Upon forming the patterned upper copper containing integrated circuit inductor winding layers 39a and 39b, there is formed an inductor structure within the integrated circuit whose schematic cross-sectional diagram is illustrated in FIG. 6. A schematic plan view diagram of the inductor structure whose schematic cross-sectional diagram is illustrated in FIG. 6 is illustrated in FIG. 7. Shown in FIG. 7 is the patterned upper copper containing integrated circuit inductor winding layers 39a and 39b formed upon the planarized second dielectric layer 30, with the patterned inductor core layer 28 and the patterned lower copper containing integrated circuit inductor winding layers 23a, 23b and 23c formed beneath the planarized second dielectric layer 30. Although not specifically illustrated in FIG. 7 or FIG. 6, the patterned upper copper containing integrated circuit inductor winding layers 39a and 39b bridge to the corresponding patterned lower copper containing integrated circuit inductor winding layers 23a, 23b and 23c preferably through a series of copper containing interconnection vias 40a, 40b, 40c and 40d located within the planarized second dielectric layer 30.

Upon forming the integrated circuit inductor structure whose schematic cross-sectional diagram is illustrated in FIG. 7, there is formed a copper containing integrated circuit inductor structure wherein there is avoided interdiffusion of patterned copper containing conductor layers within the copper containing integrated circuit inductor structure with integrated circuit layers adjoining the copper containing integrated circuit inductor structure. Such interdiffusion is avoided by employing within the present invention patterned nickel containing conductor layers as barrier layers separating the patterned copper containing conductor layers from integrated circuit layers adjoining the copper containing integrated circuit inductor structure.

EXAMPLE

A series of patterned copper containing integrated circuit conductor element structures was formed upon a semiconductor substrate in accord with the preferred embodiment of the present invention. In forming the series of copper containing integrated circuit conductor element structures there was employed a (100) silicon semiconductor substrate having a P-doping at a resistivity of about 15–25 micro-ohm.cm. The silicon semiconductor substrate was thermally annealed to provide a thermally grown silicon oxide layer of thickness about 6000 angstroms upon the semiconductor substrate. A polysilicon layer of thickness about 3000 angstroms was then formed upon the silicon oxide layer through a low pressure chemical vapor deposition (LPCVD) method. There was then formed upon the polysilicon layer a series of patterned photoresist layers from a PFi 1-4788 positive photoresist material available from Sumitomo Chemical Co., Ltd., 4-5-33 Kitahama Chuoku, Osaka, Japan. The patterned photoresist layers were of a thickness about 10000 angstroms and they formed a series of straight photoresist lines of width about 1.2 microns separated by a pitch of about 1.2 microns.

A series of patterned lower nickel containing conductor layers was then deposited upon portions of the blanket polysilicon layer exposed through the series of patterned photoresist layers. The patterned lower nickel containing conductor layers were formed through a first electroless plating deposition method employing a first aqueous electroless plating deposition solution comprising: (1) about 30 grams per liter nickel sulfate; (2) about 7.5 grams per liter sodium hypophosphite; (3) about 72 grams per liter sodium citrate; (4) about 45 grams per liter ammonium chloride; and (5) about 40 grams per liter ammonia (to provide a first aqueous electroless plating deposition solution of pH about 10). The first aqueous electroless plating deposition solution was maintained at a temperature of about 90 degrees centigrade, while electrolessly plating the patterned lower nickel containing conductor layers to a thickness of about 2000 angstroms each. The phosphorus content within each of the patterned lower nickel containing conductor layers so formed was determined through energy dispersive spectroscopy (EDS) to be about 4 percent.

The patterned lower nickel containing conductor layers were then cleaned through immersion in a 10 percent hydrofluoric acid solution for several seconds, followed by rinsing in deionized water.

The patterned lower nickel containing conductor layers were then activated through immersion of the semiconductor substrate in an aqueous activator solution comprising: (1) about 0.2 grams per liter palladium chloride; (2) about 500 milliliters per liter glacial acetic acid; and (3)about 245 milliliters per liter 49 percent hydrofluoric acid solution. The semiconductor substrate was immersed for a time period of about 10 seconds and subsequently rinsed with deionized water.

There was then selectively electrolessly deposited upon the patterned lower nickel containing conductor layers a corresponding series of patterned copper containing conductor layers. The patterned copper containing conductor layers were selectively electrolessly deposited employing a second aqueous electroless plating deposition solution comprising: (1) about 7.5 grams per liter copper sulfate; (2) about 18 grams per liter sodium citrate; (3) about 11.2 grams per liter sodium hypophosphite; (4) about 9.2 grams per liter boric acid; (5) about 0.5 grams per liter nickel sulfate; and (6) about 0.5 grams per liter thiourea, to yield a second electroless plating solution of pH about 9.2. The patterned copper containing conductor layers deposited from the second aqueous electroless plating deposition solution were formed to a thickness of about 6000 angstroms upon the patterned lower nickel containing conductor layers. The average grain size of copper within the patterned copper containing conductor layers was determined by transmission electron microscopy to be about 2000 angstroms, while through energy dispersive spectroscopy (EDS) there was determined to be within the patterned copper containing conductor layers a copper content of about 94 percent, a nickel content of about 3 percent and a phosphorus content of about 3 percent.

There was then stripped from the semiconductor substrate the patterned photoresist layers. The blanket polysilicon layer was then patterned through a reactive ion etch (RIE) method employing the patterned copper containing conductor layers and the patterned nickel containing conductor layers as an etch mask.

There was then formed upon the exposed portions of the patterned copper containing conductor layers, the patterned nickel containing conductor layers and the patterned polysilicon layers a series of patterned upper nickel containing conductor layers. The patterned upper nickel containing conductor layers were formed through a method, materials and thickness equivalent to the method, materials and thickness employed in forming the patterned lower nickel containing conductor layers.

There was then formed upon the semiconductor substrate including the copper containing conductor structures comprised of the patterned lower nickel containing conductor layers, the patterned copper containing conductor layers and the patterned upper nickel containing conductor layers a blanket silicon oxide dielectric layer formed through a plasma enhanced chemical vapor deposition (PECVD) method to a thickness of about 11000 angstroms.

The semiconductor substrate was then thermally annealed in an atmospheric ambient environment at a temperature of about 350 degrees centigrade for a time period of about one hour. For comparison purposes, an otherwise equivalent semiconductor substrate having copper containing conductor layers formed thereupon without upper or lower nickel containing conductor layers formed thereupon was also thermally annealed in an atmospheric ambient environment at a temperature of about 350 degrees centigrade for a time period of about one hour. The extent of interdiffusion of the patterned copper containing conductor layers formed upon each of the semiconductor substrates was then determined through transmission electron microscopy (TEM) and energy dispersive spectroscopy (EDS). For the semiconductor substrate having the patterned lower nickel containing conductor layers and the patterned upper nickel containing conductor layers formed surrounding the patterned copper containing conductor layers, there was observed no interdiffusion of the patterned copper containing conductor layers with layers adjoining the patterned copper containing conductor structures, while for the semiconductor substrate having formed thereupon the patterned copper containing conductor layers in the absence of the patterned lower nickel containing conductor layers and the patterned upper nickel containing conductor layers there was observed interdiffusion of the patterned copper containing conductor layers with integrated circuit layers adjoining the patterned copper containing conductor layers.

As is understood by a person skilled in the art, the preferred embodiment and example of the present invention are illustrative of the present invention rather than limiting of the present invention. Revisions and modifications may be made to methods, materials, structures and dimensions through which are provided the preferred embodiment and example of the present invention while still providing embodiments and examples which are within the spirit and scope of the present invention, as defined by the accompanying claims.

What is claimed is:

1. A method for fabricating a copper containing integrated structure within an integrated circuit comprising:

providing a substrate layer;

forming a nickel containing conductor layer over the substrate layer; and forming upon the nickel containing conductor layer a copper containing conductor layer, where the copper containing conductor layer is employed within a copper containing integrated circuit inductor structure within the integrated circuit.

2. The method of claim 1 wherein the substrate layer is chosen from the group of substrate layers consisting of conductor substrate layers, semiconductor substrate layers and insulator substrate layers.

3. The method of claim 1 wherein the nickel containing conductor layer has a thickness of from about 1000 to about 2000 angstroms.

4. The method of claim 1 wherein the nickel containing conductor layer has a phosphorus content of from about 3.2 to about 4.8 weight percent.

5. The method of claim 1 wherein the nickel containing conductor layer serves as a barrier layer to interdiffusion of the copper containing conductor layer with the substrate layer.

6. A method for fabricating a copper containing integrated circuit structure within an integrated circuit comprising:

providing a substrate layer;

forming over the substrate layer a polysilicon layer;

forming through a first electroless plating method a nickel containing conductor layer upon the polysilicon layer;

activating the nickel containing conductor layer to form an activated nickel surface of the nickel containing conductor layer; and forming through a second electroless plating method a copper containing conductor layer upon the nickel conductor layer.

7. The method of claim 6 wherein the copper containing integrated circuit structure is a copper containing integrated circuit inductor structure.

8. The method of claim 7 wherein the substrate layer is chosen from the group of substrate layers consisting of silicon substrate layers and silicon oxide substrate layers.

9. The method of claim 6 wherein:

the nickel containing conductor layer is from about 1000 to about 2000 angstroms thick; and the nickel containing conductor layer has a phosphorus content of from about 3.2 to about 4.8 weight percent.

10. The method of claim 9 wherein the first electroless plating method employs an electroless nickel plating solution comprising:

about 25 to about 35 grams per liter nickel sulfate;

about 5 to about 10 grams per liter sodium hypophosphite;

about 64 to about 80 grams per liter sodium citrate; and about 40 to about 50 grams per liter ammonium chloride.

11. The method of claim 6 wherein the nickel containing conductor layer is activated through contact with an aqueous activator solution comprising:

about 0.1 to about 0.2 grams per liter palladium salt;

about 450 to about 550 milliliters per liter glacial acetic acid; and about 200 to about 300 milliliters per liter 49 percent hydrofluoric acid.

12. The method of claim 6 wherein the second electroless plating method employs a nickel mediator ion.

13. The method of claim 12 wherein:

the copper containing conductor layer has a thickness of from about 8000 to about 12000 angstroms;

the copper containing conductor layer has a phosphorus content of from about 2 to about 3 weight percent; and the copper containing conductor layer has a nickel content of from about 2 to about 3 weight percent.

14. The method of claim 13 wherein the second electroless plating method employs an aqueous plating solution comprising:

about 7 to about 10 grams per liter copper sulfate;

about 15 to about 20 grams per liter sodium citrate;

about 7.5 to about 11.5 grams per liter sodium hypophosphite;

about 7.5 to about 12.5 grams per liter boric acid; and about 0.35 to about 0.75 grams per liter nickel sulfate.

15. The method of claim 6 wherein the polysilicon layer has a thickness of from about 1000 to about 3000 angstroms.

16. The method of claim 15 wherein:

the polysilicon layer functions as an adhesion promoter layer; and the nickel containing conductor layer functions as a barrier layer.

17. The method of claim 6 further comprising forming upon the copper containing conductor layer a second nickel containing conductor layer.

18. The method of claim 1 wherein:

the nickel containing conductor layer is formed over the substrate through a first electroless plating method;

the nickel containing conductor layer is activated to form an activated nickel surface of the nickel containing conductor layer prior to forming the copper containing conductor layer upon the nickel containing conductor layer; and the copper containing conductor layer is formed upon the nickel containing conductor layer through a second electroless plating method.

* * * * *